I (12) United States Patent
Tseng et al.

(10) Patent No.: US 9,443,588 B2
(45) Date of Patent: Sep. 13, 2016

(54) RESISTIVE MEMORY SYSTEM, DRIVER CIRCUIT THEREOF AND METHOD FOR SETTING RESISTANCE THEREOF

(71) Applicant: Industrial Technology Research Institute, Hsinchu (TW)

(72) Inventors: Pei-Ling Tseng, Miaoli County (TW); Chia-Chen Kuo, Hualien County (TW); Shyh-Shyuan Sheu, Taipei (TW); Meng-Fan Chang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/749,651

(22) Filed: Jun. 25, 2015

(65) Prior Publication Data

US 2016/0118120 A1   Apr. 28, 2016

Related U.S. Application Data

(60) Provisional application No. 62/068,764, filed on Oct. 27, 2014.

(30) Foreign Application Priority Data

Dec. 5, 2014   (TW) .............................. 103142435 A

(51) Int. Cl.
*G11C 11/00* (2006.01)
*G11C 11/36* (2006.01)
*G11C 13/00* (2006.01)

(52) U.S. Cl.
CPC .................................. *G11C 13/0097* (2013.01)

(58) Field of Classification Search
USPC ......................................... 365/148, 163, 175
See application file for complete search history.

(56) References Cited

U.S. PATENT DOCUMENTS 7,894,236 B2 *   2/2011   Oh ......................... G11C 5/145
                                                  365/148
7,965,538 B2   6/2011   Ahn et al.
(Continued)

FOREIGN PATENT DOCUMENTS

TW   201013673   4/2010
TW   201324509   6/2013

OTHER PUBLICATIONS

Chang et al."19.4 embedded 1Mb ReRAM in 28nm CMOS with 0.27-to-1V read using swing-sample-and-couple sense amplifier and self-boost-write-termination scheme," 2014 IEEE International Solid-State Circuits Conference Digest of Technical Papers (ISSCC), Feb. 12, 2014, pp. 332-333.
(Continued)

*Primary Examiner* — Trong Phan
(74) *Attorney, Agent, or Firm* — Jianq Chyun IP Office

(57) ABSTRACT

A resistive memory system, a driver circuit thereof and a method for setting resistances thereof are provided. The resistive memory system includes a memory array, a row selection circuit, a first control circuit and a second control circuit. The memory array has a plurality of resistive memory cells. The row selection circuit is used for activating the resistive memory cells. The first control circuit and the second control circuit are coupled to the resistive memory cells. When each of resistive memory cells is set, the first control circuit and the second control circuit respectively provide a set voltage and a ground voltage to the each of resistive memory cells to form a set current, and the set current is clamped by at least one of the first control circuit and the second control circuit.

16 Claims, 9 Drawing Sheets

(56) References Cited

U.S. PATENT DOCUMENTS

| | | | |
|---|---|---|---|
| 8,411,484 B2* | 4/2013 | Aoki | G11C 13/0007 365/148 |
| 8,787,068 B2* | 7/2014 | Seko | G11C 13/0007 365/148 |
| 9,019,743 B2* | 4/2015 | Tsai | G11C 11/21 365/148 |
| 2011/0317482 A1 | 12/2011 | Pyeon | |
| 2012/0020141 A1 | 1/2012 | Kitagawa et al. | |
| 2012/0257437 A1 | 10/2012 | Seko et al. | |
| 2014/0104927 A1 | 4/2014 | Sutardja et al. | |
| 2014/0185362 A1 | 7/2014 | Haukness | |

OTHER PUBLICATIONS

Fackenthal et al., "19.7 a 16Gb ReRAM with 200MB/s write and 1GB/s read in 27nm technology," 2014 IEEE International Solid-State Circuits Conference Digest of Technical Papers (ISSCC), Feb. 12, 2014, pp. 338-339.

Sheu et al., "A 5ns fast write multi-level non-volatile 1 K bits RRAM memory with advance write scheme," 2009 Symposium on VLSI Circuits, Jun. 16-18, 2009, pp. 82-83.

Xue et al., "A 0.13μm 8Mb logic based CuxSiyO resistive memory with self-adaptive yield enhancement and operation power reduction," 2012 Symposium on VLSI Circuits (VLSIC), Jun. 13-15, 2012, pp. 42-43.

Sheu et al., "A 4Mb embedded SLC resistive-RAM macro with 7.2ns read-write random-access time and 160ns MLC-access capability," 2011 IEEE International Solid-State Circuits Conference Digest of Technical Papers (ISSCC), Feb. 22, 2014, pp. 200-202.

Chang et al., "Area-Efficient Embedded Resistive RAM (ReRAM) Macros Using Logic-Process Vertical-Parasitic-BJT (VPBJT) Switches and Read-Disturb-Free Temperature-Aware Current-Mode Read Scheme," IEEE Journal of Solid-State Circuits, Apr. 2014, pp. 908-916.

Fujii et al., "A 45 ns 16 Mb DRAM with triple-well structure," 1989 IEEE International Solid-State Circuits Conference, Feb. 17, 1989, pp. 248-249.

"Office Action of Europe Counterpart Application", issued on Feb. 23, 2016, p. 1-p. 8, in which the listed references were cited.

* cited by examiner

RESISTIVE MEMORY SYSTEM, DRIVER CIRCUIT THEREOF AND METHOD FOR SETTING RESISTANCE THEREOF

CROSS-REFERENCE TO RELATED APPLICATION

This application claims the priority benefits of U.S. provisional application Ser. No. 62/068,764, filed on Oct. 27, 2014 and Taiwan application serial no. 103142435, filed on Dec. 5, 2014. The entirety of each of the above-mentioned patent applications is hereby incorporated by reference herein and made a part of this specification.

TECHNICAL FIELD

The disclosure relates to a memory system, and a resistive memory system, a driver circuit thereof and a method for setting resistance thereof.

BACKGROUND

As a non-volatile memory has an advantage that data stored therein is not disappeared after power-off, it is a necessary memory element in many electronic products for maintaining a normal operation thereof. Presently, a resistive random access memory (RRAM) is one type of the non-volatile memory that is actively developed in the industry, and since it has advantages of low writing operation voltage, short write and erase time, long retention time, non-destructive reading, multi-level capability, simple structure and small cell area, etc., it has a great application potential in future personal computers and electronic equipment.

A resistive memory cell is a memory that stores data through a resistance level, for example, a low resistance state represents logic level 0, and a high resistance state represents logic level 1. Further, if a positive voltage is applied to the resistive memory cell, the resistive memory cell can be transferred from the high resistance state to the low resistance state, which is referred to as a set operation. Conversely, if a negative voltage is applied to the resistive memory cell, the resistive memory cell is transferred from the low resistance state to the high resistance state, which is referred to as a reset operation. However, since electrical conditions of the set operation and the reset operation are different (for example, set currents are different), the set operation and the reset operation generally cannot be simultaneously applied to a plurality of resistive memory cells of a same row, which influences the write speed and the array efficiency of a resistive memory system.

SUMMARY

The disclosure provides a driver circuit, which is adapted to drive a memory array having a plurality of resistive memory cells. The driver circuit includes a row selection circuit, a first control circuit and a second control circuit. The row selection circuit is coupled to the resistive memory cells, and is used for activating the resistive memory cells. The first control circuit is coupled to the resistive memory cells, and is used for providing a set voltage and a ground voltage. The second control circuit is coupled to the resistive memory cells, and is used for providing a reset voltage and the ground voltage. When each of the resistive memory cells is set, the first control circuit provides the set voltage to the each of the resistive memory cells, and the second control circuit provides the ground voltage to the each of the resistive memory cells to form a set current, and the set current is clamped by at least one of the first control circuit and the second control circuit.

The disclosure provides a resistive memory system including a memory array and the aforementioned driver circuit, wherein the memory array has a plurality of resistive memory cells, and the driver circuit is used for driving the resistive memory cells.

In an embodiment of the disclosure, the resistive memory cells are coupled to the row selection circuit through a plurality of row selection lines, the resistive memory cells are coupled to the first control circuit through a plurality of bit lines, and the resistive memory cells are coupled to the second control circuit through a plurality of source lines, wherein the row selection circuit is used for enabling one of the row selection lines.

The disclosure provides a method for setting resistance of a resistive memory system, which is adapted to the resistive memory system having a plurality of resistive memory cells, and the method for setting resistance includes following steps. It is determined whether each of the resistive memory cells is set. When each of the resistive memory cells is set, a set voltage is provided to each of the resistive memory cells through a first control circuit, and a ground voltage is provided to each of the resistive memory cells through a second control circuit to form a set current, wherein the set current is clamped by at least one of the first control circuit and the second control circuit. When each of the resistive memory cells is not set, the first control circuit is controlled not to provide the set voltage to each of the resistive memory cells.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

The disclosure is a resistive memory system, a driver circuit thereof and a method for setting resistance thereof, by which a set operation and a reset operation can be simultaneously applied to a plurality of resistive memory cells of a same row, so as to improve a write speed and an array efficiency of the resistive memory system.

The resistive memory system, the driver circuit and the method for setting resistance of the disclosure, when the resistive memory cell is set, the set current is clamped by at least one of the first control circuit and the second control circuit other than the switch transistor of the resistive memory cell. In this way, the set operation and the reset operation can be simultaneously implemented to the resistive memory cells of the same row, so as to improve the write speed and the array efficiency of the resistive memory system.

Figure 1A:
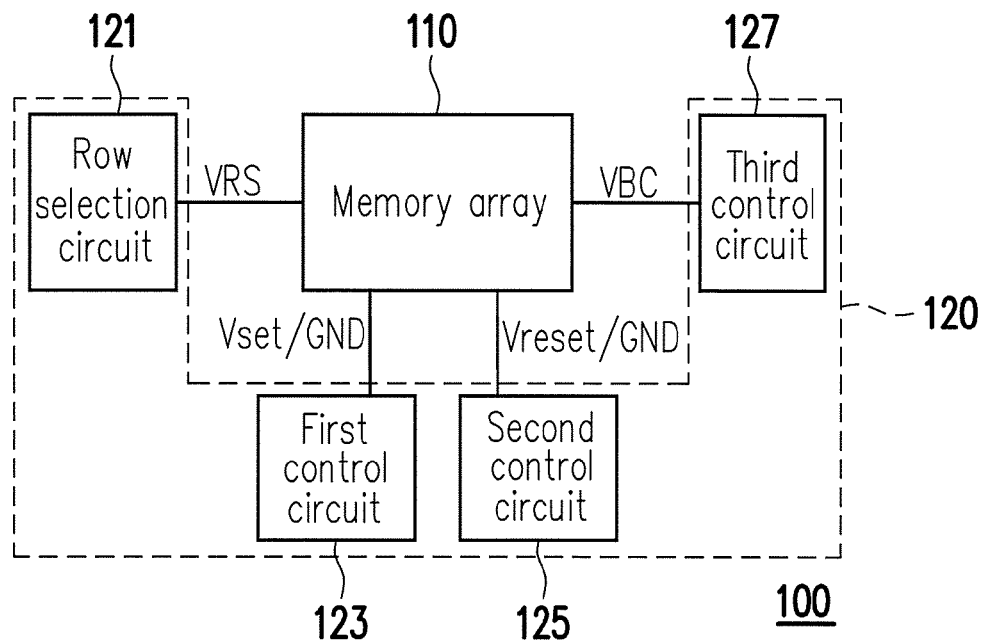
FIG. 1A is a system schematic diagram of a resistive memory system according to an embodiment of the disclosure.

FIG. 1A is a system schematic diagram of a resistive memory system according to an embodiment of the disclosure. Referring to FIG. 1A, in the present embodiment, the resistive memory system 100, for example, includes a memory array 110 and a driver circuit 120, wherein the driver circuit 120 is coupled to the memory array 110 to drive the memory array 110, and includes a row selection circuit 121, a first control circuit 123, a second control circuit 125 and a third control circuit 127, for instance.

The row selection circuit 121 is coupled to the memory array 110, and provides a row selection voltage VRS to the memory array 110. The first control circuit 123 is coupled to the memory array 110, and provides a set voltage Vset or a pound voltage GND to the memory array 110. The second control circuit 125 is coupled to the memory array 110, and provides a reset voltage Vreset or the ground voltage GND to the memory array 110. The third control circuit 127 is coupled to the memory array 110, and provides a bulk control voltage VBC to the memory array 110.

Figure 1B:
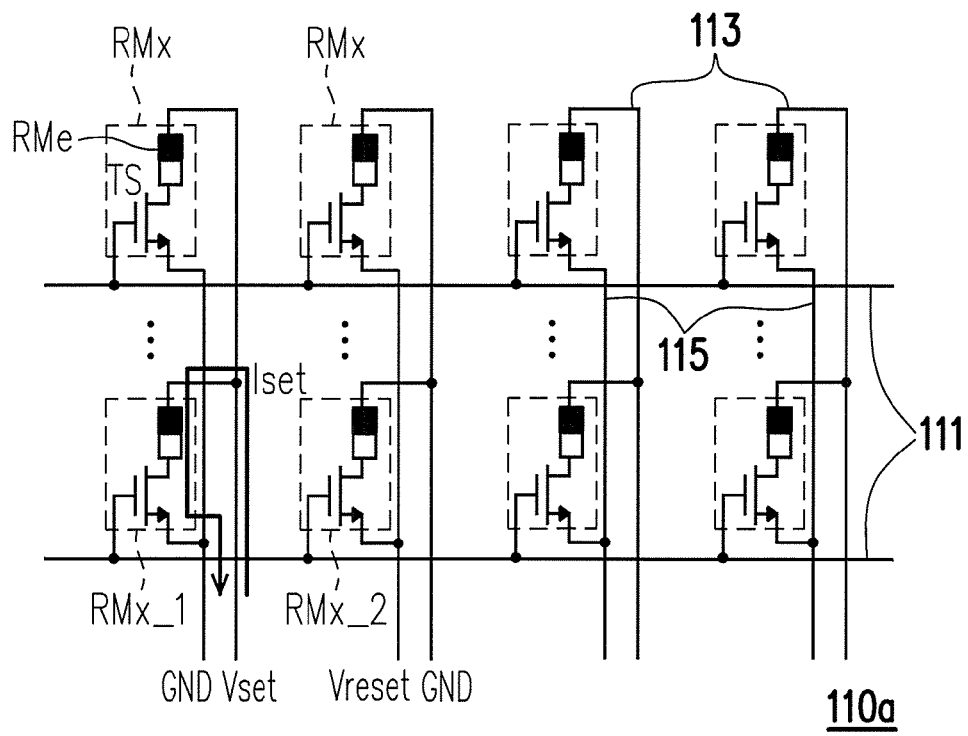
FIG. 1B is a circuit schematic diagram of a memory array of FIG. 1A according to an embodiment of the disclosure.

FIG. 1B is a circuit schematic diagram of the memory array of FIG. 1A according to an embodiment of the disclosure. Referring to FIG. 1A and FIG. 1B, the same or like reference numerals in the drawings denote the same or like elements. In one embodiment, the memory array 110a, for example, includes a plurality of resistive memory cells RMx, a plurality of row selection lines 111, a plurality of bit lines 113 and a plurality of source lines 115. Each of the resistive memory cells RMx, for example, includes a resistive memory element RMe and a switch transistor TS.

In each of the resistive memory cells RMx, one end of the resistive memory element RMe is coupled to the corresponding bit line 113 for coupling to the first control circuit 123, and receives the set voltage Vset or the ground voltage GND provided by the first control circuit 123, wherein the set voltage Vset is used for setting the resistive memory element RMe. A drain (corresponding to a first terminal) of the switch transistor TS is coupled to another end of the resistive memory element RMe, a gate (corresponding to a control terminal) of the switch transistor TS is coupled to the corresponding row selection line 111 for coupling to the row selection circuit 121, and receives the row selection voltage VRS provided by the row selection circuit 121, and a source (corresponding to a second terminal) of the switch transistor TS is coupled to the corresponding source line 115 for coupling to the second control circuit 125, and receives the reset voltage Vreset or the ground voltage GND provided by the second control circuit 125, wherein the reset voltage Vreset is used for resetting the resistive memory element RMe. The resistive memory cell RMx can be regarded as a resistive memory cell having three control terminals.

In one embodiment, the row selection circuit 121 is used for enabling one of the row selection lines 111 to activate the resistive memory cells RMx of a row, and performs the set operation and the reset operation to the activated resistive memory cells RMx. In other words, when the resistive memory cell RMx is set (for example, shown as a resistive memory cell RMx_1), the first control circuit 123 provides the set voltage Vset to the resistive memory cell RMx_1, and the second control circuit 125 provides the ground voltage GND to the resistive memory cell RMx_1 to form a set current Iset, wherein the set current Iset is clamped by at least one of the first control circuit 123 and the second control circuit 125, such that the resistive memory cell RMx_1 can normally implement the set operation.

When the resistive memory cell RMx is reset (for example, shown as a resistive memory cell RMx_2), the first control circuit 123 provides the ground voltage GND to the resistive memory cell RMx_2, and the second control circuit 125 provides the reset voltage Vreset to the resistive memory cell RMx_2, so as to perform the reset operation to the resistive memory cell RMx_2.

According to the above description, through the first control circuit 123 and/or the second control circuit 125 having the a current clamping function, the resistive memory cells RMx of the same row can simultaneously implement the set operation and the reset operation, so as to improve a write speed and an array efficiency of the resistive memory system 100.

Moreover, the third control circuit 127 can be coupled to a bulk (not shown) of the switch transistor TS of the activated resistive memory cell RMx through a trace (not shown), and controls a threshold voltage Vth of the switch transistor TS by changing a bulk voltage $V_{SB}$ (i.e. the bulk control voltage VBC) of the switch transistor TS. Taking an N-type transistor as an example, a relationship between the bulk voltage $V_{SB}$ of the switch transistor TS and the threshold voltage Vth is as follow:

$$V_{th} = V_{T0} + \gamma(\sqrt{V_{SB}+2\phi} - \sqrt{2\phi})$$

Wherein, $V_{T0}$ is a threshold voltage between the bulk and the source without a potential difference, $\gamma$ is a substrate effect parameter, $2\phi$ is a parameter related to a semiconductor energy level (a difference between bandgap midline and Fermi level). According to the above equation, the smaller the bulk voltage $V_{SB}$ is, the smaller the threshold voltage Vth is, and decrease of the threshold voltage Vth may cause decrease of an equivalent resistance of the switch transistor TS, i.e. the resistive memory cell RMx is more easy to be written, so as to increase of successfully writing the resistive memory cell RMx.

Figure 2A:
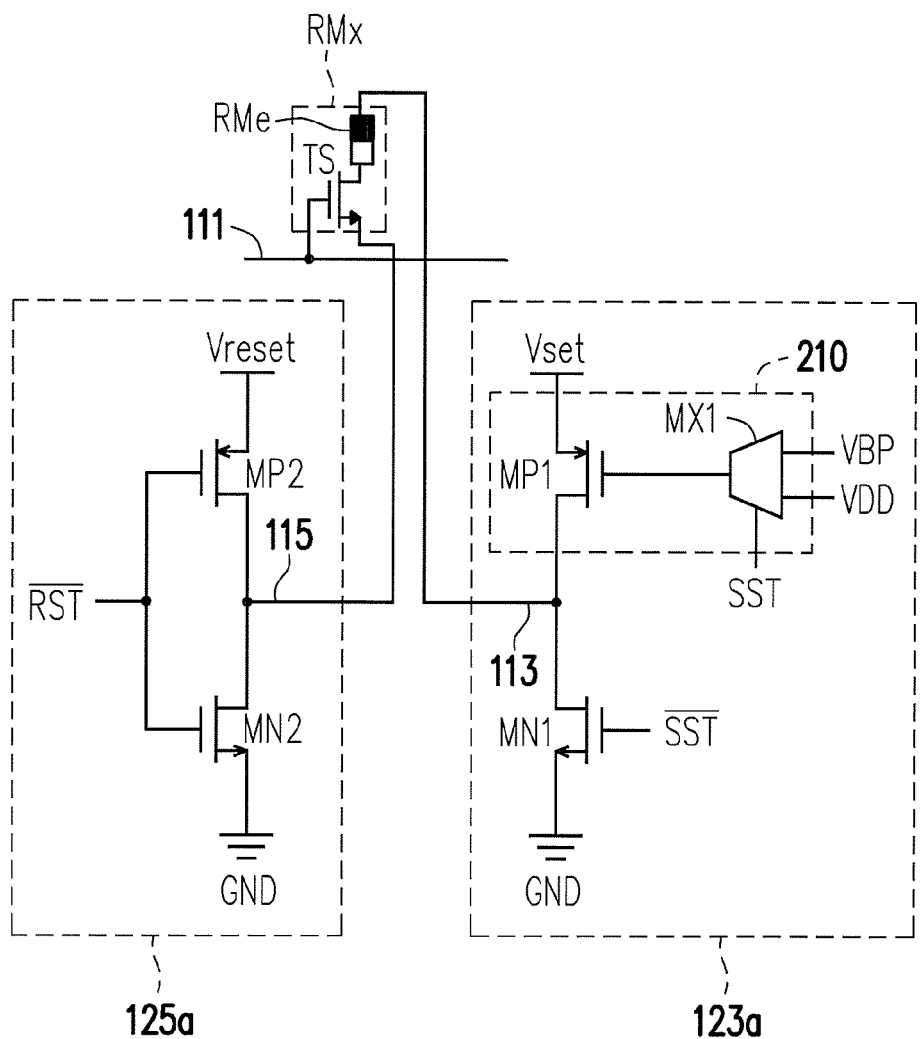
FIG. 2A is a circuit schematic diagram of a first control circuit and a second control circuit of FIG. 1A according to an embodiment of the disclosure.

FIG. 2A is a circuit schematic diagram of the first control circuit and the second control circuit of FIG. 1A according to an embodiment of the disclosure. Referring to FIG. 1A, FIG. 1B and FIG. 2A, the same or like reference numerals in the drawings denote the same or like elements. In an embodiment, the first control circuit 123a, for example, includes a first current clamping unit 210 and a first N-type transistor MN1, wherein the first current clamping unit 210 is used for providing the set voltage Vset and clamping the set current Iset.

Further, the first current clamping unit 210 includes a first P-type transistor MP1 and a first multiplexer MX1, wherein the first P-type transistor MP1 can be regarded as a clamp transistor. A source (corresponding to a first terminal) of the transistor MP1 receives the set voltage Vset, a drain (corresponding to a second terminal) of the transistor MP1 is coupled to the corresponding bit line 113. An output terminal of the multiplexer MX1 is coupled to a gate (corresponding to a control terminal) of the transistor MP1, input terminals of the multiplexer MX1 receive a first current clamping voltage VBP and an operation voltage VDD, and a control terminal of the multiplexer MX1 receives a set signal SST. A drain (corresponding to a first terminal) of the transistor MN1 is coupled to the corresponding bit line 113, a source (corresponding to a second terminal) of the transistor MN1 receives the ground voltage GND, and a gate (corresponding to a control terminal) of the transistor MN1 receives an inverted signal $\overline{SST}$ of the set signal SST.

According to the above description, the multiplexer MX1 provides the first current clamping voltage VBP or the operation voltage VDD to the gate of the transistor MP1 according to the set signal SST, wherein the first current clamping voltage VBP is used for clamping the set current Iset. In other words, when the resistive memory cell RMx is set, the set signal SST is enabled (for example, has a high voltage level). Now, the transistor MN1 is turned off, and the multiplexer MX1 provides the first current clamping voltage VBP to the gate of the transistor MP1 according to the set signal SST, so as to provide the set voltage Vset through the transistor MP1 and clamp the set current Iset. When the resistive memory cell RMx is not set, the set signal SST is disabled (for example, has a low voltage level). Now, the transistor MN1 is turned on, so as to provide the ground voltage GND through the transistor MN1, and the multiplexer MX1 provides the operation voltage VDD to the gate of the transistor MP1 according to the set signal SST, so as to turn off the transistor MP1.

In one embodiment, the second control circuit 125a, for example, includes a second P-type transistor MP2 and a second N-type transistor MN2. A source (corresponding to a first terminal) of the transistor MP2 receives the reset voltage Vreset, a drain (corresponding to a second terminal) of the transistor MP2 is coupled to the corresponding source line 115, and a gate (corresponding to a control terminal) of the transistor MP2 receives an inverted signal $\overline{RST}$ of the reset signal RST. A drain (corresponding to a first terminal) of the transistor MN2 is coupled to the corresponding source line 115, a source (corresponding to a second terminal) of the transistor MN2 receives the ground voltage GND, and a gate (corresponding to a control terminal) of the transistor MN2 receives the inverted signal $\overline{RST}$ of the reset signal RST.

In other words, when the resistive memory cell RMx is reset, the reset signal RST is enabled (for example, has the high voltage level). Now, the transistor MP2 is turned on, and the transistor MN2 is turned off, so as to provide the reset voltage Vreset through the transistor MP2. When the resistive memory cell RMx is not reset, the reset signal RST is disabled (for example, has the low voltage level). Now, the transistor MN2 is turned on, so as to provide the ground voltage GND through the transistor MN2, and the transistor MP2 is turned off.

Figure 2B:
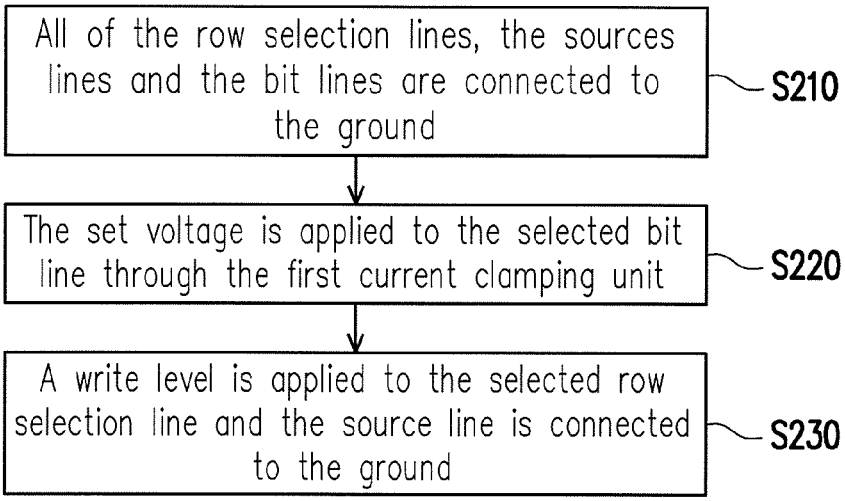
FIG. 2B is a flowchart illustrating a method for setting resistance of a resistive memory system according to an embodiment of the disclosure.

FIG. 2B is a flowchart illustrating a method for setting resistance of a resistive memory system according to an embodiment of the disclosure. Referring to FIG. 2A and FIG. 2B, in an embodiment, the method for setting resistance of the resistive memory system includes following steps. First, all of the row selection lines, the sources lines and the bit lines are connected to the ground (step S210). Then, the set voltage is applied to the selected bit line through the first current clamping unit (step S220). Finally, a write level is applied to the selected row selection line and the source line is connected to the ground (step S230).

Figure 3A:
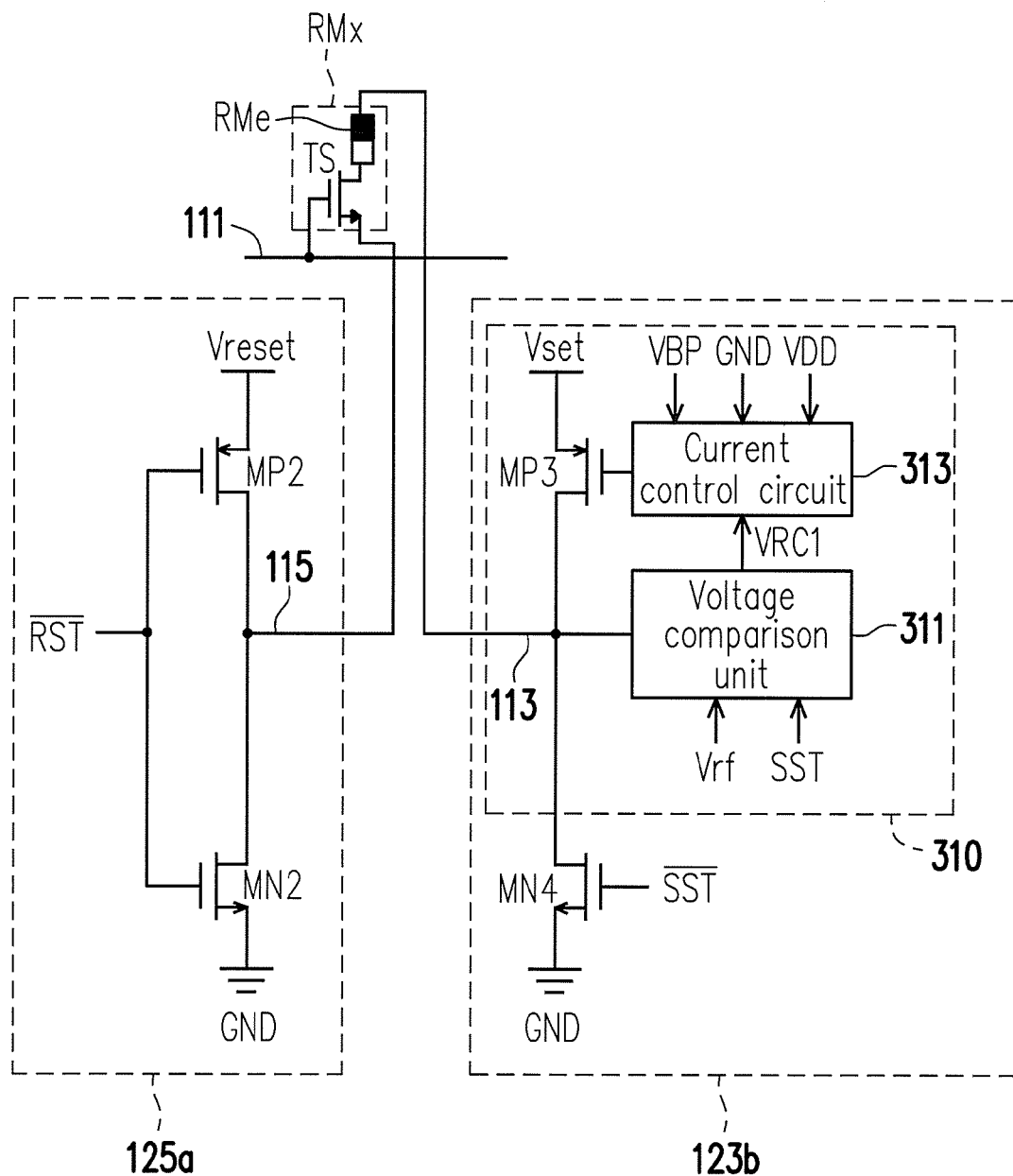
FIG. 3A is a circuit schematic diagram of a first control circuit and a second control circuit of FIG. 1A according to another embodiment of the disclosure.

FIG. 3A is a circuit schematic diagram of the first control circuit and the second control circuit of FIG. 1A according to another embodiment of the disclosure. Referring to FIG. 1A, FIG. 1B, FIG. 2A and FIG. 3A, the same or like reference numerals in the drawings denote the same or like elements, and the second control circuit 125a may refer to FIG. 2A, and detail thereof is not repeated. In one embodiment, the first control circuit 123b, for example, includes a first current clamping unit 310 and a fourth N-type transistor MN4.

Further, the first current clamping unit 310, for example, includes a third P-type transistor MP3, a voltage comparison unit 311 and a current control circuit 313, wherein the third P-type transistor MP3 can be regarded as a clamp transistor. A source (corresponding to a first terminal) of the transistor MP3 receives the set voltage Vset, a drain (corresponding to a second terminal) of the transistor MP3 is coupled to the corresponding bit line 113. The current control circuit 313 is coupled to a gate (corresponding to a control terminal) of the third P-type transistor MP3, and receives the first current clamping voltage VBP, the ground voltage GND, the operation voltage VDD and a comparison result voltage VRC1, and when each of the resistive memory cells RMx is not set (i.e. the set operation is not performed), the current control circuit 313 provides the operation voltage VDD to the gate of the third P-type transistor MP3 to turn off the third P-type transistor MP3. When each of the resistive memory cells RMx is set (i.e. the set operation is performed), the current control circuit 313 provides the first current clamping voltage VBP or the ground voltage GND to the gate of the third P-type transistor MP3 according to the comparison result voltage VRC1, wherein the first current clamping voltage VBP is used for clamping the set current Iset.

The voltage comparison unit 311 is coupled to the corresponding bit line 113 and the current control circuit 313, receives a reference voltage Vrf and the set signal SST, is activated in response to the set signal SST, and compares a voltage level of the corresponding bit line 113 and the reference voltage Vrf to determine whether the voltage level of the corresponding bit line 113 reaches a write level. The voltage comparison unit 311 provides the comparison result voltage VRC1 to the current control circuit 313 according to a comparison result. A drain (corresponding to a first terminal) of the transistor MN4 is coupled to the corresponding bit line 113, a source (corresponding to a second terminal) of the transistor MN4 receives the ground voltage GND, and a gate (corresponding to a control terminal) of the transistor MN4 receives the inverted signal $\overline{SST}$ of the set signal SST.

According to the above description, when the resistive memory cell RMx is set, the set signal SST is enabled (for example, has the high voltage level). Now, the transistor MN4 is turned off, and the voltage comparison unit 311 is activated. Then, when the voltage level of the corresponding bit line 113 does not reach the write level, i.e. the reference voltage Vrf is greater than the voltage level of the corresponding bit line 113, the voltage comparison unit 311 provides the comparison result voltage VRC1 with the low voltage level. Now, the current control circuit 313 provides the ground voltage GND to the gate of the transistor MP3 to turn on the transistor MP3 according to the comparison result voltage VRC1 with the low voltage level, so as to accelerate an increasing speed of the voltage level of the corresponding bit line 113.

When the voltage level of the corresponding bit line 113 reaches or exceeds the write level, i.e. the reference voltage Vrf is smaller than or equal to the voltage level of the corresponding bit line 113, the voltage comparison unit 311 provides the comparison result voltage VRC1 with the high voltage level. Now, the current control circuit 313 provides the first current clamping voltage VBP to the gate of the transistor MP3 according to the comparison result voltage VRC1 with the high voltage level, so as to provide the set voltage Vset through the transistor MP3 and clamp the set current Iset.

When the resistive memory cell RMx is not set, the set signal SST is disabled (for example, has the low voltage level). Now, the voltage comparison unit 311 is turned off, and the transistor MN4 is turned on, so as to provide the ground voltage GND through the transistor MN4, and the current control circuit 313 provides the operation voltage VDD to the gate of the transistor MP3 to turn off the transistor MP3. Therefore, the voltage level of the corresponding bit line 113 is equal to the ground voltage GND.

Figure 3B:
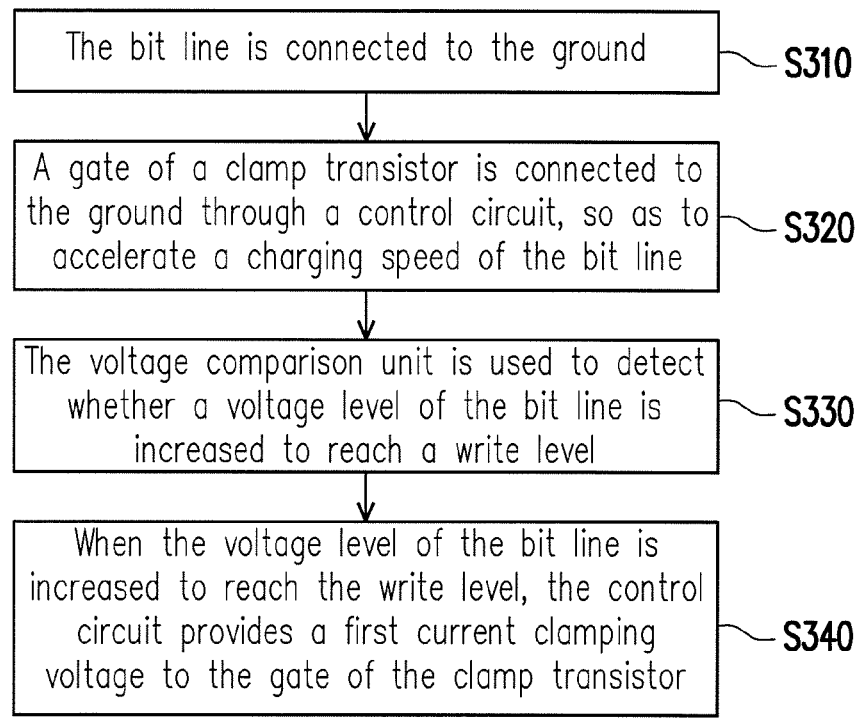
FIG. 3B is a flowchart illustrating a method for setting resistance of a resistive memory system according to an embodiment of the disclosure.

FIG. 3B is a flowchart illustrating a method for setting resistance of a resistive memory system according to an embodiment of the disclosure. Referring to FIG. 3A and FIG. 3B, in an embodiment, the method for setting resistance of the resistive memory system includes following steps. First, the bit line is connected to the ground (step S310), a gate of a clamp transistor is connected to the ground through a control circuit, so as to accelerate a charging speed of the bit line (step S320). Then, the voltage comparison unit is used to detect whether a voltage level of the bit line is increased to reach a write level (step S330), and when the voltage level of the bit line is increased to reach the write level, the control circuit provides a first current clamping voltage to the gate of the clamp transistor (step S340).

Figure 3C:
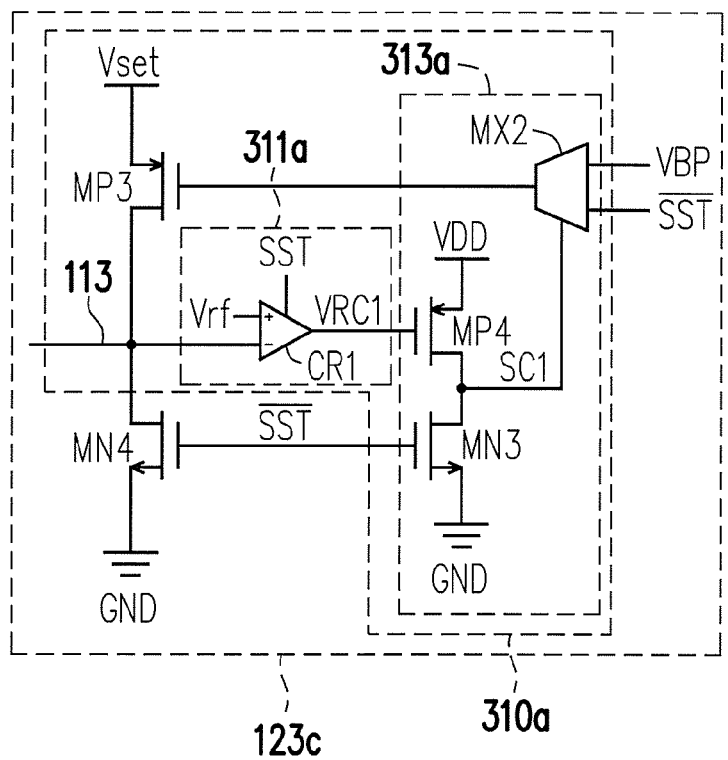
FIG. 3C is a circuit schematic diagram of the first control circuit of FIG. 3A according to an embodiment of the disclosure.

FIG. 3C is a circuit schematic diagram of the first control circuit of FIG. 3A according to an embodiment of the disclosure. Referring to FIG. 3A and FIG. 3C, the same or like reference numerals in the drawings denote the same or like elements, and the second control circuit may refer to the second control circuit 125a of FIG. 2A, and detail thereof is not repeated. In one embodiment, the first control circuit 123c is substantially the same to the first control circuit 123b, and a difference therebetween lies in the first current clamping unit 310a. In the first current clamping unit 310a, the voltage comparison unit 311a, for example, includes a comparator CR1, and the current control circuit 313a, for example, includes a fourth P-type transistor MP4, a third N-type transistor MN3 and a second multiplexer MX2.

An output terminal of the multiplexer MX2 is coupled to a gate (corresponding to a control terminal) of the transistor MP3, input terminals of the multiplexer MX2 receive the first current clamping voltage VBP and the inverted signal $\overline{SST}$ of the set signal SST, and a control terminal of the multiplexer MX2 receives a control signal SC1. A source (corresponding to a first terminal) of the transistor MP4 receives the operation voltage VDD, a drain (corresponding to a second terminal) of the transistor MP4 is used for providing the control signal SC1, and a gate of the transistor MP4 is coupled to an output terminal of the comparator CR1. A drain (corresponding to a first terminal) of the transistor MN3 is coupled to the drain of the transistor MP4, a source (corresponding to a second terminal) of the transistor MN3 receives the ground voltage GND, and a gate (corresponding to a control terminal) of the transistor MN3 receives the inverted signal $\overline{SST}$ of the set signal SST.

A negative input terminal of the comparator CR1 is coupled to the corresponding bit line 113, a positive input terminal of the comparator CR1 receives the reference voltage Vrf, and an enable terminal of the comparator CR1 receives the set signal SST, and the comparator CR1 is enabled in response to the set signal SST. When the comparator CR1 is enabled, the comparator CR1 compares the voltage level of the corresponding bit line 113 and the reference voltage Vrf to determine whether the voltage level of the corresponding bit line 113 reaches the write level, and accordingly provides the comparison result voltage VRC1 to the gate of the transistor MP4.

According to the above description, when the resistive memory cell RMx is not set, the multiplexer MX2 provides the inverted set signal $\overline{SST}$ with a level of the operation voltage VDD to the gate of the transistor MP3 according to the control signal SC1. When the resistive memory cell is set, the multiplexer MX2 provides the first current clamping voltage VBP or the inverted set signal $\overline{SST}$ with a level of the ground voltage GND to the gate of the transistor MP3 according to the control signal SC1. In other words, when the resistive memory cell RMx is set, the set signal SST is enabled (for example, has the high voltage level), and now the transistors MN3 and MN4 are turned off. Moreover, when the voltage level of the corresponding bit line 113 does not reach the write level, i.e. the reference voltage Vrf is greater than the voltage level of the corresponding bit line 113, the comparator CR1 provides the comparison result voltage VRC1 with the high voltage level to turn off the transistor MP4. Now, the multiplexer MX2 provides the inverted set signal $\overline{SST}$ with a level of the ground voltage GND to the gate of the transistor MP3 according to the control signal SC1 with a level of the ground voltage GND, so as to turn on the transistor MP3 to accelerate the increasing speed of the voltage level of the corresponding bit line 113.

When the voltage level of the corresponding bit line 113 reaches or exceeds the write level, i.e. the reference voltage Vrf is smaller than or equal to the voltage level of the corresponding bit line 113, the comparator CR1 provides the comparison result voltage VRC1 with the low voltage level to turn on the transistor MP4, so as to increase the control signal SC1 to the operation voltage VDD. The multiplexer MX2 provides the first current clamping voltage VBP to the gate of the transistor MP3 according to the control signal SC1 with a level of the operation voltage VDD (which is equivalent to the high voltage level), so as to provide the set voltage Vset through the transistor MP3 and clamp the set current Iset.

When the resistive memory cell RMx is not set, the set signal SST is disabled (for example, has the low voltage level). Now, the comparator CR1 is turned off, and the transistors MN3 and MN4 are turned on, so as to provide the ground voltage GND through the transistor MN4, and the multiplexer MX2 provides the inverted set signal $\overline{SST}$ with a level of the operation voltage VDD to the gate of the transistor MP3 according to the control signal SC1, so as to turn off the transistor MP3. Therefore, the voltage level of the corresponding bit line 113 is decreased to the ground voltage GND.

According to the above description, when the voltage level of the corresponding bit line 113 does not reach the write level, the transistor MP3 is turned on to provide a larger current to the corresponding bit line 113, so as to accelerate increasing of the voltage level of the corresponding bit line 113. When the voltage level of the corresponding bit line 113 reaches or exceeds the write level, the set current Iset is clamped through the transistor MP3. In this way, a time for setting the resistive memory cell RMx may be shortened.

Figure 3D:
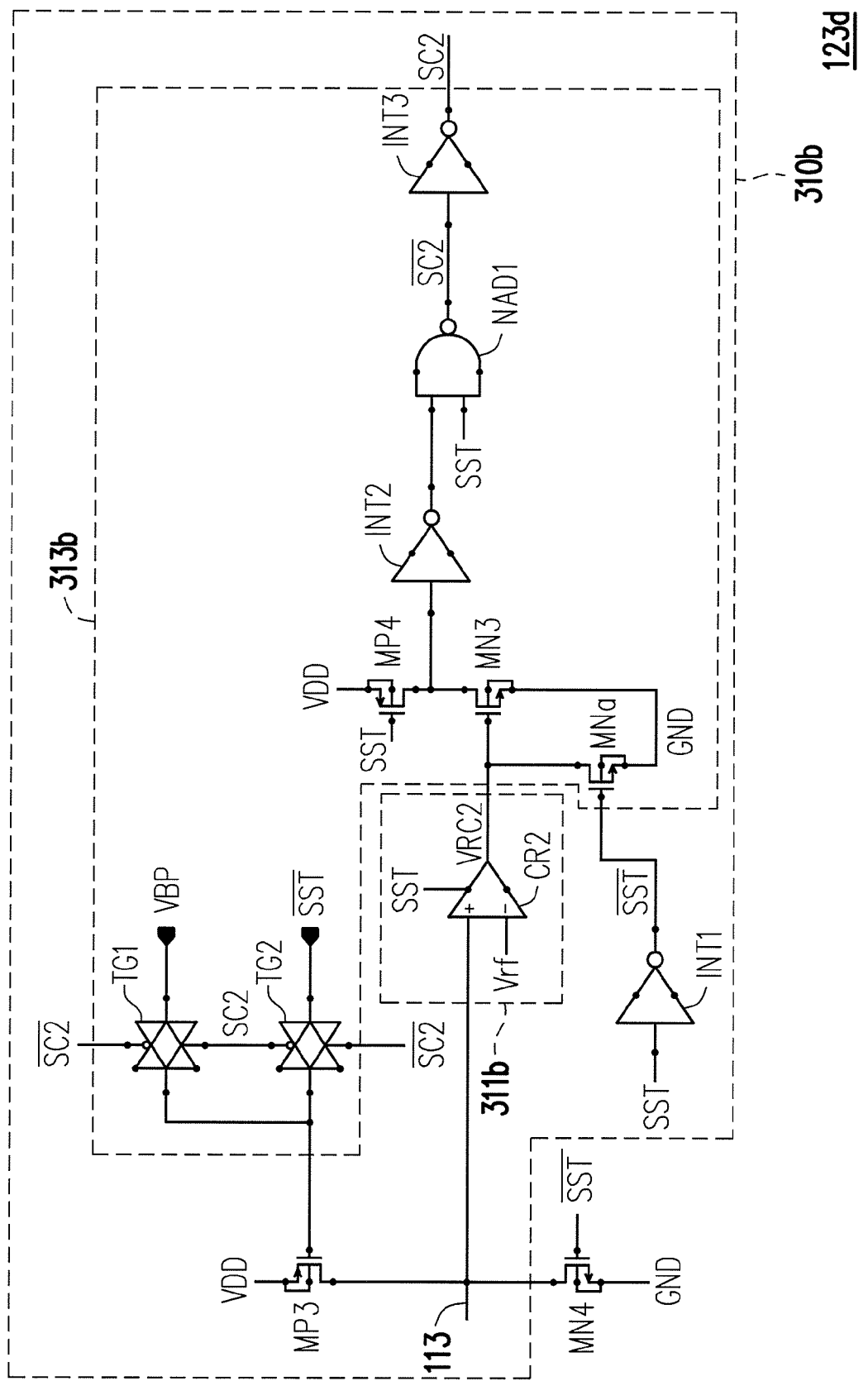
FIG. 3D is a circuit schematic diagram of the first control circuit of FIG. 3A according to an embodiment of the disclosure.

FIG. 3D is a circuit schematic diagram of the first control circuit of FIG. 3A according to an embodiment of the disclosure. Referring to FIG. 3A, FIG. 3C and FIG. 3D, the same or like reference numerals in the drawings denote the same or like elements, and the second control circuit may refer to the second control circuit 125a of FIG. 2A, and detail thereof is not repeated. In an embodiment, a circuit structure of the first control circuit 123d is substantially the same to that of the first control circuit 123c, and a difference therebetween lies in the first current clamping unit 310b, and the first current clamping unit 310b further includes an inverter INT1. In the first current clamping unit 310b, the voltage comparison unit 311b, for example, includes a comparator CR2, and the current control circuit 313b, for example, includes a fourth P-type transistor MP4, a third N-type transistor MN3, an N-type transistor MNa, transmission gates TG1, TG2, inverters INT2, INT3 and an NAND gate NAD1. Here, the inverter INT1 is, for example, configured in the first current clamping unit 310b, though in other embodiments, the inverter INT1 can be configured outside the first current clamping unit 310b, which is not limited by the disclosure.

A source (corresponding to a first terminal) of the transistor MP3 receives the set voltage Vset, a drain (corresponding to the second terminal) of the transistor MP3 is coupled to the corresponding bit line 113. An input terminal of the transmission gate TG1 receives the first current clamping voltage VBP, a positive control terminal of the transmission gate TG1 receives a control signal SC2, a negative control terminal of the transmission gate TG1 receives an inverted signal $\overline{SC2}$ of the control signal SC2, and an output terminal of the transmission gate TG1 is coupled to the gate of the transistor MP3. An input terminal of the transmission gate TG2 receives the inverted signal $\overline{SST}$ of the set signal SST, a positive control terminal of the transmission gate TG2 receives the inverted signal $\overline{SC2}$ of the control signal SC2, a negative control terminal of the transmission gate TG2 receives the control signal SC2, and an output terminal of the transmission gate TG2 is coupled to the gate of the transistor MP3, wherein the transmission gates TG1 and TG2 have a function similar to that of the multiplexer MX2.

A source of the transistor MP4 receives the operation voltage VDD, and a gate of the transistor MP4 receives the set signal SST. A drain of the transistor MN3 is coupled to a drain of the transistor MP4, a source of the transistor MN3 receives the ground voltage GND, and a gate of the transistor MN3 is coupled to an output terminal of the comparator CR2. A positive input terminal of the comparator CR2 is coupled to the corresponding bit line 113, a negative input terminal of the comparator CR2 receives the reference voltage Vrf, an enable terminal of the comparator CR2 receives the set signal SST, and the output terminal of the comparator CR2 provides a comparison result voltage VRC2. A drain of the transistor MNa is coupled to the gate of the transistor MN3, a source of the transistor MNa receives the ground voltage GND, and a gate of the transistor MN3 receives the inverted signal $\overline{SST}$ of the set signal SST.

An input terminal of the inverter INT1 receives the set signal SST, and an output terminal of the inverter INT1 provides the inverted signal $\overline{SST}$ of the set signal SST. An input terminal of the inverter INT2 is coupled to the drain of the MP4. Input terminals of the NAND gate NAD1 are coupled to an output terminal of the inverter INT2 and received the set signal SST, and an output terminal of the NAND gate NAD1 provides the inverted signal $\overline{SC2}$ of the control signal SC2. An input terminal of the inverter INT3 receives the inverted signal $\overline{SC2}$ of the control signal SC2, and an output terminal of the inverter INT3 provides the control signal SC2.

A drain of the transistor MN4 is coupled to the corresponding bit line 113, a source of the transistor MN4 receives the ground voltage GND, and a gate of the transistor MN4 receives the inverted signal $\overline{SST}$ of the set signal SST.

Figure 3E:
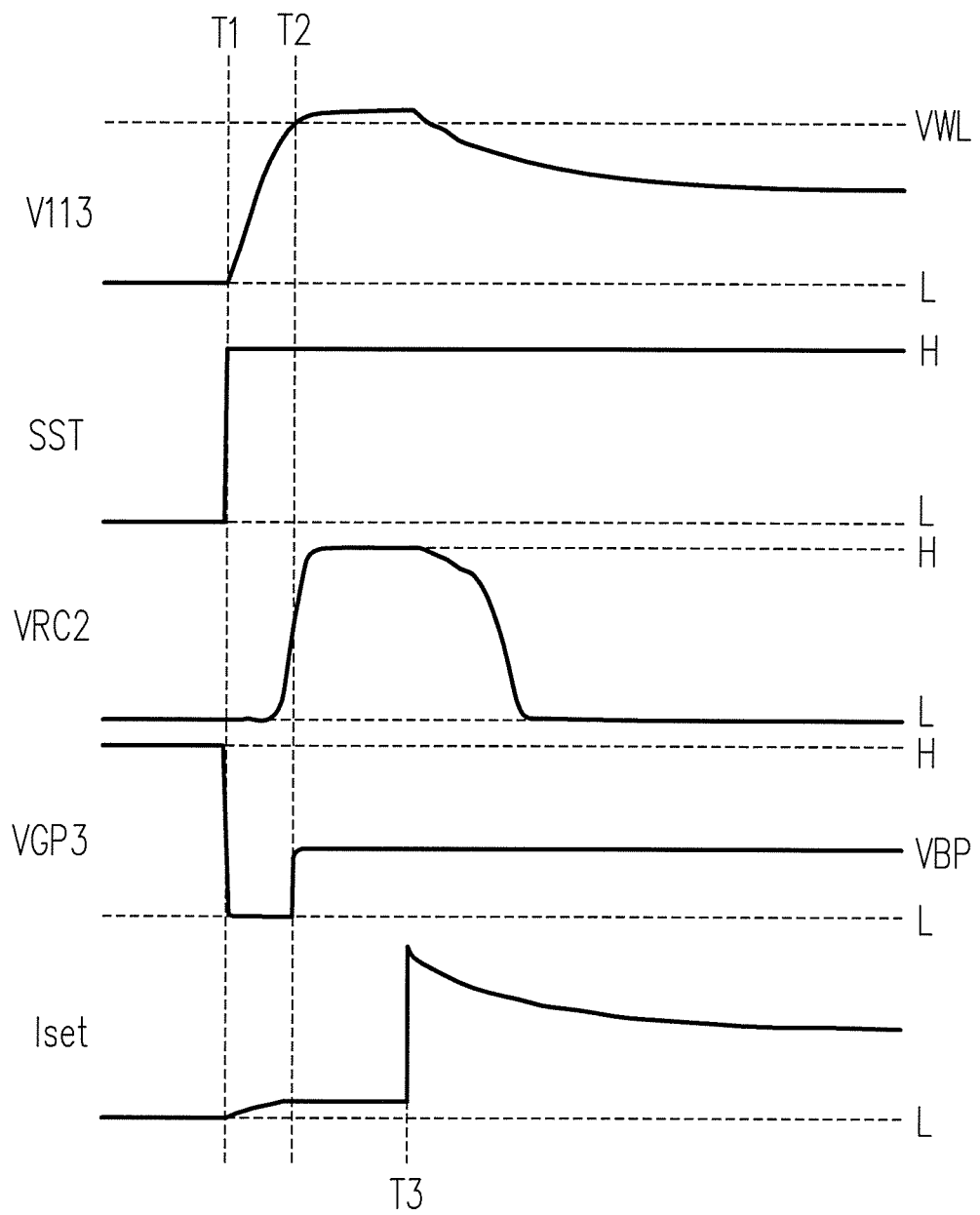
FIG. 3E is a driving waveform diagram of the first control circuit of FIG. 3D according to an embodiment of the disclosure.

FIG. 3E is a driving waveform diagram of the first control circuit of FIG. 3D according to an embodiment of the disclosure. Referring to FIG. 3D and FIG. 3E, before a time point T1, it is assumed that the resistive memory cell RMx is not set, such that the set signal SST is disabled (for example, has a low voltage level L). Now, the comparator CR2 is turned off (i.e. output the low voltage level L), and the transistor MNa, the transistor MP4 and the transistor MN4 are turned on, so as to provide the ground voltage (i.e. the low voltage level L) to the corresponding bit line 113 through the transistor MN1. Moreover, the control signal SC2 has a high voltage level H, such that the inverted signal $\overline{SST}$ of the high voltage level H is provided to the gate of the transistor MP3 (a gate voltage VGP3) through the transmission gate TG2, so as to turn off the transistor MP3.

After the time point T1, it is assumed that the resistive memory cell RMx is set, so that the set signal SST is enabled (for example, has the high voltage level H). Now, the comparator CR2 is activated to compare the voltage level of the corresponding bit line 113 and the reference voltage Vrf, and provides the comparison result voltage VRC2 according to a comparison result. Moreover, the transistor MNa, the transistor MP4 and the transistor MN4 are turned off.

During a period between the time point T1 and a time point T2, the voltage level V113 of the corresponding bit line 113 does not reach a write level VWL, i.e. the reference voltage Vrf is greater than the voltage level V113 of the corresponding bit line 113, so that the comparator CR2 provides the comparison result voltage VRC2 with the low voltage level L to turn off the transistor MN3, such that the control signal SC2 still has the high voltage level H. Now, the inverted signal $\overline{SST}$ with the low voltage level L is transmitted to the gate of the transistor MP3 (i.e. the gate voltage VGP3) to turn on the transistor MP3.

After the time point T2, the voltage level V113 of the corresponding bit line 113 reaches or exceeds the write level VWL, i.e. the reference voltage Vrf is smaller than the voltage level of the corresponding bit line 113, such that the comparator CR2 provides the comparison result voltage VRC2 with the high voltage level H to turn on the transistor MN3, and the control signal SC2 is switched to the low voltage level L. Now, the first current clamping voltage VBP is provided to the gate of the transistor MP3 (i.e. the gate voltage VGP3) through the transmission gate TG1, so as to clamp the set current Iset. At a time point T3, the resistive memory cell RMx that is set successfully is transferred to a low resistance state, such that the set current Iset is greatly increased.

Figure 4A:
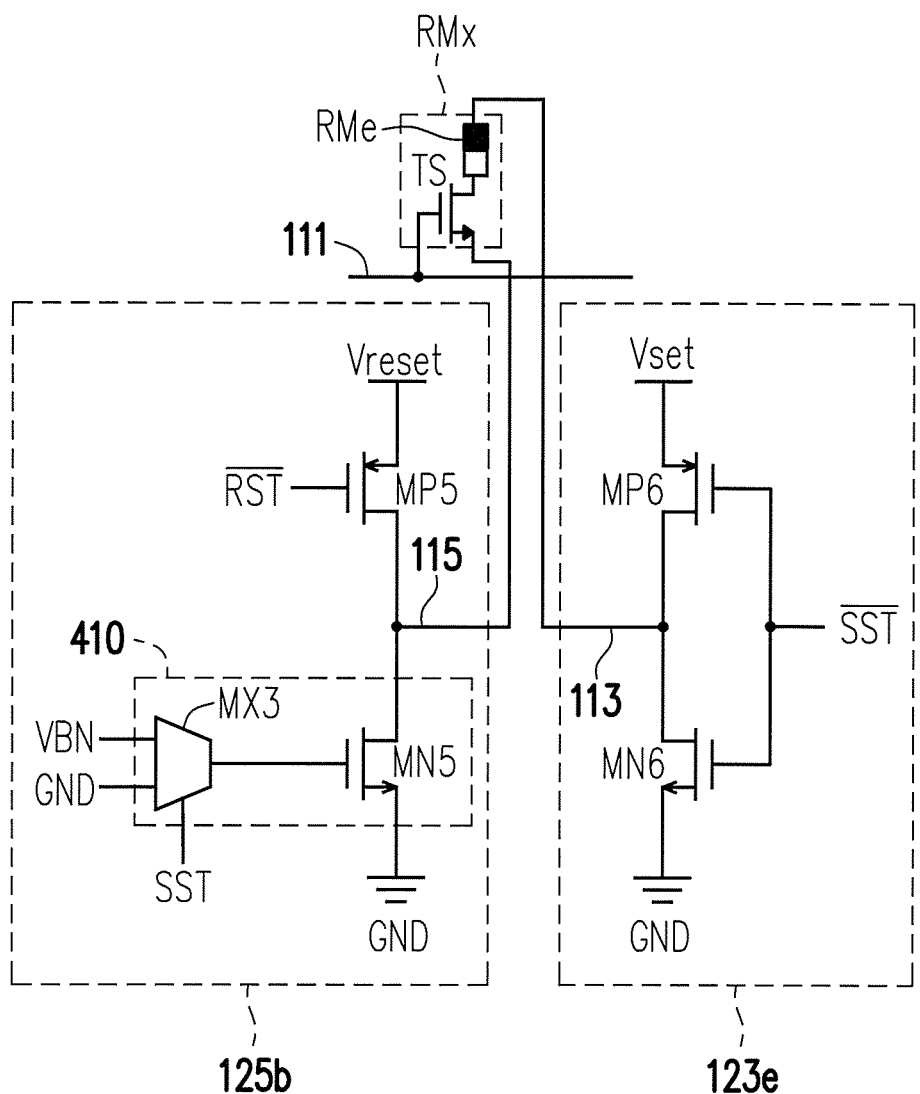
FIG. 4A is a circuit schematic diagram of a first control signal and a second control signal of FIG. 1A according to an embodiment of the disclosure.

FIG. 4A is a circuit schematic diagram of the first control signal and the second control signal of FIG. 1A according to an embodiment of the disclosure. Referring to FIG. 1A, FIG. 1B and FIG. 4A, the same or like reference numerals in the drawings denote the same or like elements. In an embodiment, the second control circuit 125b, for example, includes a second current clamping unit 410 and a fifth P-type transistor MP5, wherein the second current clamping unit 410 is used for providing the ground voltage GND and clamping the set current Iset.

Further, the second current clamping unit 410, for example, includes a fifth N-type transistor MN5 and a third multiplexer MX3. A drain (corresponding to a first terminal) of the transistor MN5 is coupled to the corresponding source line 115, and a source (corresponding to a second terminal) of the transistor MN5 receives the ground voltage GND. An output terminal of the multiplexer MX3 is coupled to a gate (corresponding to a control terminal) of the transistor MN5, input terminals of the multiplexer MX3 receives a second current clamping voltage VBN and the ground voltage GND, and a control terminal of the multiplexer MX3 receives the set signal SST. A source (corresponding to a first terminal) of the transistor MP5 receives the reset voltage Vreset, a drain (corresponding to a second terminal) of the transistor MP5 is coupled to the corresponding source line 115, and a gate (corresponding to a control terminal) of the transistor MP5 receives the inverted signal $\overline{RST}$ of the reset signal RST.

According to the above description, the multiplexer MX3 provides the second current clamping voltage VBN or the ground voltage GND to the gate of the transistor MN5 according to the set signal SST, wherein the second current clamping voltage VBN is used for clamping the set current Iset. In other words, when the resistive memory cell RMx is set, the set signal SST is enabled (for example, has the high voltage level), and the reset signal RST is disabled. Now, the transistor MP5 is turned off, and the multiplexer MX3 provides the second current clamping voltage VBN to the gate of the transistor MN5 according to the set signal SST, so as to provide the ground voltage GND through the transistor MN5 and clamp the set current Iset. When the resistive memory cell RMx is not set, the set signal SST is disabled (for example, has the low voltage level), and it is assumed that the reset signal RST is still disabled. Now, the transistor MP5 is still turned off, and the multiplexer MX5 provides the ground voltage GND to the gate of the transistor MN5 according to the set signal SST, so as to turn off the transistor MN5.

In one embodiment, the first control circuit 123e, for example, includes a sixth P-type transistor MP6 and a sixth N-type transistor MN6. A source (corresponding to a first terminal) of the transistor MP6 receives the set voltage Vset, a drain (corresponding to a second terminal) of the transistor MP6 is coupled to the corresponding bit line 113, and a gate (corresponding to a control terminal) of the transistor MP6 receives the inverted signal $\overline{SST}$ of the set signal SST. A drain (corresponding to a first terminal) of the transistor MN6 is coupled to the corresponding bit line 113, a source (corresponding to a second terminal) of the transistor MN6 receives the ground voltage GND, and a gate (corresponding to a control terminal) of the transistor MN6 receives the inverted signal $\overline{SST}$ of the set signal SST.

In other words, when the resistive memory cell RMx is set, the set signal SST is enabled (for example, has the high voltage level). Now, the transistor MP6 is turned on and the transistor MN6 is turned off, so as to provide the set voltage Vset through the transistor MP6. When the resistive memory cell RMx is not set, the set signal SST is disabled (for example, has the low voltage level). Now, the transistor MN6 is turned on, so as to provide the ground voltage GND through the transistor MN6, and the transistor MP6 is turned off.

Figure 4B:
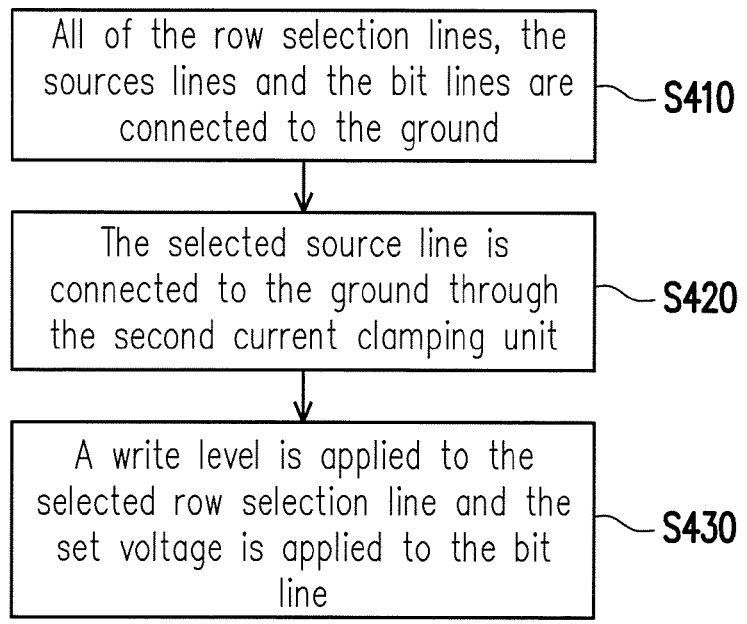
FIG. 4B is a flowchart illustrating a method for setting resistance of a resistive memory system according to an embodiment of the disclosure.

FIG. 4B is a flowchart illustrating a method for setting resistance of a resistive memory system according to an embodiment of the disclosure. Referring to FIG. 4A and FIG. 4B, in an embodiment, the method for setting resistance of the resistive memory system includes following steps. First, all of the row selection lines, the sources lines and the bit lines are connected to the ground (step S410). Then, the selected source line is connected to the ground through the second current clamping unit (step S420). Finally, a write level is applied to the selected row selection line and the set voltage is applied to the bit line (step S430).

Figure 5:
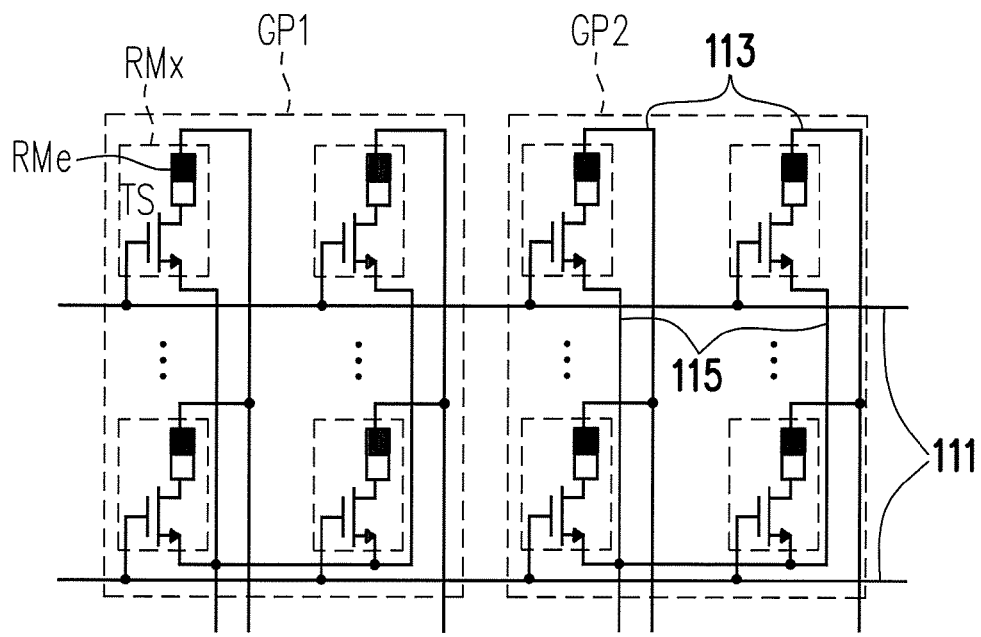
FIG. 5 is a circuit schematic diagram of a memory array of FIG. 1A according to an embodiment of the disclosure.

FIG. 5 is a circuit schematic diagram of the memory array of FIG. 1A according to an embodiment of the disclosure. Referring to FIG. 1A, FIG. 1B and FIG. 5, wherein the same or like reference numerals in the drawings denote the same or like elements, and the memory array 110b is substantially the same to the memory array 110a, and a difference therebetween is that in the memory array 110b, the resistive memory cells RMx, the row selection lines 111, the bit lines 113 and the source lines 115 are grouped into a plurality of groups (for example, groups GP1, GP2). Moreover, the source lines 115 of each of the groups (for example, the groups GP1, GP2) are coupled to each other first and are then coupled to the second control circuit 125.

In the aforementioned embodiment, the set current Iset is clamped by one of the first control circuit 123 and the second control circuit 125, though in other embodiments, the first control circuit 123 and the second control circuit 125 are simultaneously used to clamp the current Iset, i.e. the second control circuit 125b can be paired to one of the first control circuit 123a-123d to drive the memory array 110.

Figure 6:
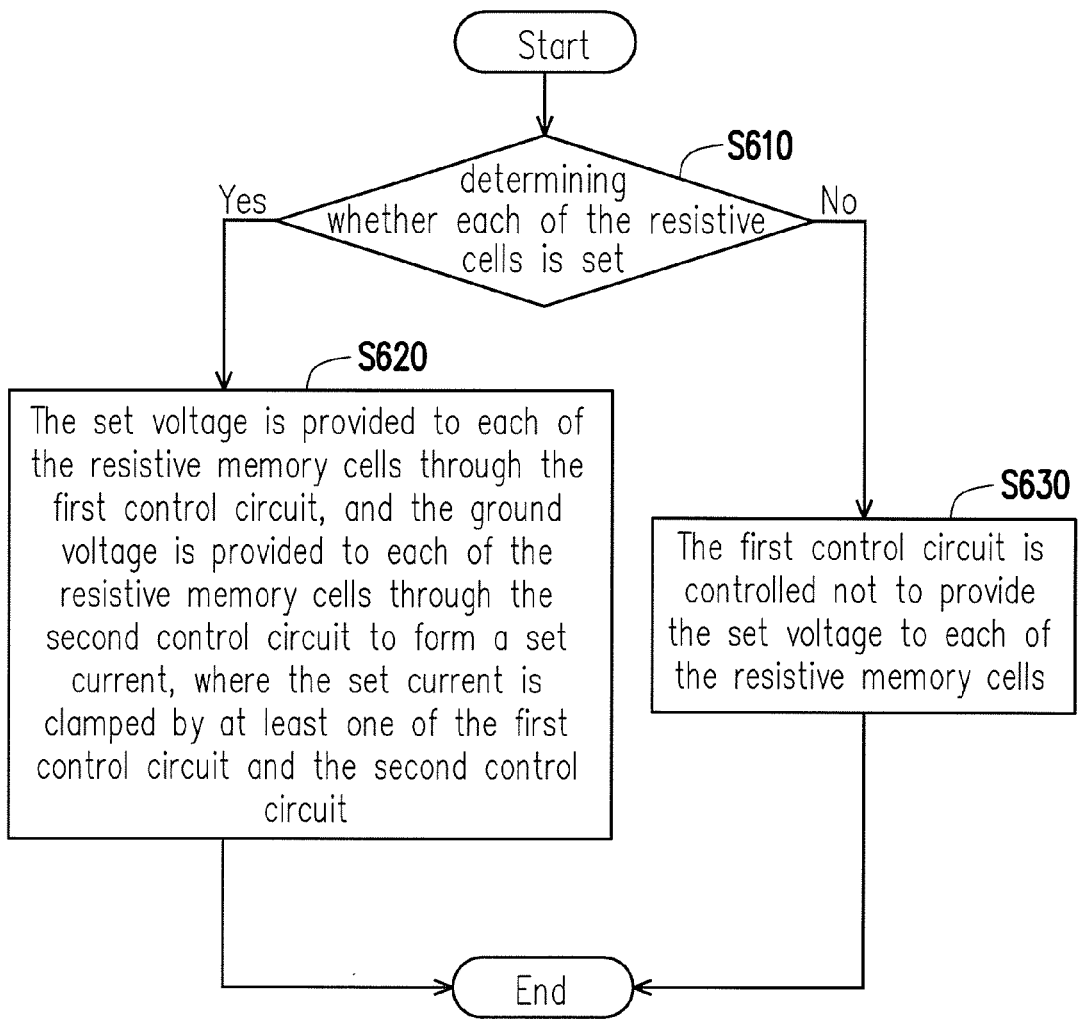
FIG. 6 is a flowchart illustrating a method for setting resistance of a resistive memory system according to an embodiment of the disclosure.

FIG. 6 is a flowchart illustrating a method for setting resistance of a resistive memory system according to an embodiment of the disclosure. Referring to FIG. 6, in an embodiment, the method for setting resistance of the resistive memory system includes following steps. In step S610, it is determined whether each of the resistive cells is set, and when each of the resistive memory cells is set, i.e. when a determination result of the step S610 is "yes", the set voltage is provided to each of the resistive memory cells through the first control circuit, and the ground voltage is provided to each of the resistive memory cells through the second control circuit to form a set current, wherein the set current is clamped by at least one of the first control circuit and the second control circuit (step S620). When each of the memory cells is not set, i.e. when the determination result of the step S610 is "no", the first control circuit is controlled not to provide the set voltage to each of the resistive memory cells (step S630). A sequence of the steps S610, S620 and S630 is an example, and the disclosure is not limited thereto, and details of the steps S610, S620 and S630 may refer to the descriptions of the embodiments of FIG. 1A, FIG. 1B, FIG. 2A, FIG. 2B, FIG. 3A to FIG. 3E, FIG. 4A, FIG. 4B and FIG. 5, which are not repeated.

Further, when the first control circuit includes a first current clamping unit, the step S620 may include providing the set voltage to each of the resistive memory cells through the first current clamping unit of the first control circuit, so as to clamp the set current. Moreover when the first current clamping unit is coupled to each of the resistive memory cells through a bit line, the method for setting resistance further includes following steps. A voltage level of the bit line is detected. When the voltage level of the bit line is smaller than a write level, the first current clamping unit is controlled not to clamp the set current. When the voltage level of the bit line is greater than or equal to the write level, the first current clamping unit is controlled to clamp the set current.

When the second control circuit includes a second current clamping unit, the step S620 may include providing the ground voltage to each of the resistive memory cells through the second current clamping unit of the second control circuit, so as to clamp the set current.

In summary, in the resistive memory system, the driver circuit and the method for setting resistance of the disclosure, when the resistive memory cell is set, the set current is clamped by at least one of the first control circuit and the second control circuit other than the switch transistor of the resistive memory cell. In this way, the set operation and the reset operation can be simultaneously implemented to the resistive memory cells of the same row, so as to improve the write speed and the array efficiency of the resistive memory system. Moreover, the voltage of the bulk of the switch transistor can be changed through the third control circuit, so as to control the threshold voltage of the switch transistor and accordingly improve a chance of successfully writing the resistive memory. Moreover, when the voltage level of the corresponding bit line does not reach the write level, a larger current is provided to the corresponding bit line through the first control circuit, and when the voltage level of the corresponding bit line reaches or exceeds the write level, the set current is clamped through the first control circuit. In this way, the time for setting the resistive memory cells may be shortened.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A driver circuit, adapted to drive a memory array having a plurality of resistive memory cells, the driver circuit comprising:
    a row selection circuit, coupled to the resistive memory cells, and activating the resistive memory cells;
    a first control circuit, coupled to the resistive memory cells, and providing a set voltage and a ground voltage; and
    a second control circuit, coupled to the resistive memory cells, and providing a reset voltage and the ground voltage,
    wherein when each of the resistive memory cells is set, the first control circuit provides the set voltage to each of the resistive memory cells, and the second control circuit provides the ground voltage to each of the resistive memory cells to form a set current, and the set current is clamped by at least one of the first control circuit and the second control circuit,
    wherein the resistive memory cells are coupled to the row selection circuit through a plurality of row selection lines, the resistive memory cells are coupled to the first control circuit through a plurality of bit lines, and the resistive memory cells are coupled to the second control circuit through a plurality of source lines, wherein the row selection circuit is used for enabling one of the row selection lines,
    wherein the first control circuit comprises a first current clamping unit for providing the set voltage and clamping the set current, the first current clamping unit comprises:
        a first P-type transistor, having a first terminal receiving the set voltage, a second terminal coupled to the corresponding bit line and a control terminal; and
        a first multiplexer, coupled to the control terminal of the first P-type transistor, and receiving a first current clamping voltage, an operation voltage and a set signal, and providing the first current clamping voltage or the operation voltage to the control terminal of the first P-type transistor according to the set signal, wherein the first current clamping voltage is used for clamping the set current.

2. The driver circuit as claimed in claim 1, wherein the first control circuit further comprises:
    a first N-type transistor, having a first terminal coupled to the corresponding bit line, a second terminal receiving the ground voltage and a control terminal receiving an inverted signal of the set signal.

3. The driver circuit as claimed in claim 1, wherein the second control circuit comprises:
    a second P-type transistor, having a first terminal receiving the reset voltage, a second terminal coupled to the corresponding source line and a control terminal receiving an inverted signal of the reset signal; and
    a second N-type transistor, having a first terminal coupled to the corresponding source line, a second terminal receiving the ground voltage and a control terminal receiving the inverted signal of the reset signal.

4. The driver circuit as claimed in claim 1, wherein the second control circuit comprises a second current clamping unit for providing the ground voltage and clamping the set current.

5. The driver circuit as claimed in claim 4, wherein the second current clamping unit comprises:
    a third N-type transistor, having a first terminal coupled to the corresponding source line, a second terminal receiving the ground voltage and a control terminal; and
    a second multiplexer, coupled to the control terminal of the third N-type transistor, and receiving a second current clamping voltage, the ground voltage and a set signal, and providing the second current clamping voltage or the ground voltage to the control terminal of the third N-type transistor according to the set signal, wherein the second current clamping voltage is used for clamping the set current.

6. The driver circuit as claimed in claim 5, wherein the second control circuit further comprises:
    a third P-type transistor, having a first terminal receiving the reset voltage, a second terminal coupled to the corresponding source line and a control terminal receiving an inverted signal of a reset signal.

7. The driver circuit as claimed in claim 1, wherein the source lines are divided into a plurality of groups, and the source lines of each of the groups are coupled to each other for coupling to the second control circuit.

8. The driver circuit as claimed in claim 1, wherein each of the resistive memory cells comprises:
    a resistive memory element, coupled to the corresponding bit line, and setting an resistance thereof according to the set voltage and the reset voltage; and a switch transistor, having a first terminal coupled to the resistive memory element, a second terminal coupled to the corresponding source line and a control terminal coupled to the corresponding row selection line.

9. The driver circuit as claimed in claim 8, wherein further comprising:
a third control circuit, providing a bulk control voltage to a bulk terminal of the switch transistor of each of the resistive memory cells.

10. A resistive memory system, comprising:
a memory array, having a plurality of resistive memory cells; and
the driver circuit as claimed in claim 1, coupled to the resistive memory cells, and driving the resistive memory cells.

11. A method for setting resistance of a resistive memory system, adapted to the resistive memory system having a plurality of resistive memory cells, and the method for setting resistance comprising:
determining whether each of the resistive memory cells is set;
providing a set voltage to each of the resistive memory cells through a first control circuit when each of the resistive memory cells is set, and providing a ground voltage to each of the resistive memory cells through a second control circuit to form a set current, wherein the set current is clamped by at least one of the first control circuit and the second control circuit; and
controlling the first control circuit to provide an inhibit voltage to each of the resistive memory cells when each of the resistive memory cells is not set,
wherein the second control circuit comprises a first current clamping unit, and the step of providing the ground voltage to each of the resistive memory cells through the second control circuit comprises:
providing the ground voltage to each of the resistive memory cells through the first current clamping unit of the second control circuit, so as to clamp the set current.

12. The method for setting resistance of the resistive memory system as claimed in claim 11, wherein the first control circuit comprises a second current clamping unit, and the step of providing the set voltage to each of the resistive memory cells through the first control circuit comprises:
providing the set voltage to each of the resistive memory cells through the second current clamping unit of the first control circuit, so as to clamp the set current.

13. The method for setting resistance of the resistive memory system as claimed in claim 12, wherein the second current clamping unit is coupled to each of the resistive memory cells through a bit line, and the method for setting resistance further comprises:
detecting a voltage level of the bit line;
controlling the second current clamping unit to transmit the set voltage without current clamping when the voltage level of the bit line is smaller than a write level;
controlling the second current clamping unit to clamp the set current when the voltage level of the bit line is greater than or equal to the write level.

14. A driver circuit, adapted to drive a memory array having a plurality of resistive memory cells, the driver circuit comprising:
a row selection circuit, coupled to the resistive memory cells, and activating the resistive memory cells;
a first control circuit, coupled to the resistive memory cells, and providing a set voltage and a ground voltage; and
a second control circuit, coupled to the resistive memory cells, and providing a reset voltage and the ground voltage,
wherein when each of the resistive memory cells is set, the first control circuit provides the set voltage to each of the resistive memory cells, and the second control circuit provides the ground voltage to each of the resistive memory cells to form a set current, and the set current is clamped by at least one of the first control circuit and the second control circuit,
wherein the resistive memory cells are coupled to the row selection circuit through a plurality of row selection lines, the resistive memory cells are coupled to the first control circuit through a plurality of bit lines, and the resistive memory cells are coupled to the second control circuit through a plurality of source lines, wherein the row selection circuit is used for enabling one of the row selection lines,
wherein the first control circuit comprises a first current clamping unit for providing the set voltage and clamping the set current, the first current clamping unit comprises:
a first P-type transistor, having a first terminal receiving the set voltage, a second terminal coupled to the corresponding bit line and a control terminal;
a current control circuit, coupled to the control terminal of the first P-type transistor, and receiving the first current clamping voltage, the ground voltage, an operation voltage and a comparison result voltage, wherein when each of the resistive memory cells is not set, the current control circuit provides the operation voltage to the control terminal of the first P-type transistor, and when each of the resistive memory cells is set, the current control circuit provides the first current clamping voltage or the ground voltage to the control terminal of the first P-type transistor according to the comparison result voltage, wherein the first current clamping voltage is used for clamping the set current; and
a voltage comparison unit, coupled to the corresponding bit line and the current control circuit, and receiving a reference voltage and a set signal, and is activated in response to the set signal, and compares a voltage level of the corresponding bit line and the reference voltage to provide the comparison result voltage to the current control circuit.

15. The driver circuit as claimed in claim 14, wherein the current control circuit comprises:
a first multiplexer, coupled to the control terminal of the first P-type transistor, and receiving the first current clamping voltage, an inverted signal of the set signal and a control signal, wherein when each of the resistive memory cells is not set, the third multiplexer receives and provides the inverted signal of the set signal with a level of the operation voltage to the control terminal of the first P-type transistor, and when each of the resistive memory cells is set, the first multiplexer provides the first current clamping voltage or the inverted signal of the set signal with a level of the ground voltage to the control terminal of the first P-type transistor according to the control signal;
a second P-type transistor, having a first terminal receiving the operation voltage, a second terminal providing the control signal and a control terminal receiving the comparison result voltage; and a first N-type transistor, having a first terminal coupled to the second terminal of the second P-type transistor, a second terminal coupled to the ground voltage and a control terminal receiving the inverted signal of the reset signal.

16. The driver circuit as claimed in claim 14, wherein the first control circuit further comprises:

a second N-type transistor, having a first terminal coupled to the corresponding bit line, a second terminal receiving the ground voltage and a control terminal receiving the inverted signal of the set signal.

* * * * *